United States Patent
Bianchi et al.

(10) Patent No.: US 12,461,207 B2
(45) Date of Patent: Nov. 4, 2025

(54) OPTOELECTRONIC DEVICE

(71) Applicant: STMicroelectronics International N.V., Geneva (CH)

(72) Inventors: Raul Andres Bianchi, Myans (FR); Christel Marie-Noëlle Buj, Grenoble (FR)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/671,527

(22) Filed: May 22, 2024

(65) Prior Publication Data

US 2024/0393439 A1    Nov. 28, 2024

(30) Foreign Application Priority Data

May 24, 2023  (FR) ..................................... 2305136

(51) Int. Cl.
*G01S 7/481* (2006.01)
*G01S 17/894* (2020.01)
*H10F 39/00* (2025.01)

(52) U.S. Cl.
CPC .......... *G01S 7/4816* (2013.01); *G01S 17/894* (2020.01); *H10F 39/8033* (2025.01); *H10F 39/807* (2025.01)

(58) Field of Classification Search
CPC ............................ H10F 30/225; H10F 77/959
See application file for complete search history.

(56) References Cited

U.S. PATENT DOCUMENTS

| | | | |
|---|---|---|---|
| 2010/0148040 A1 | 6/2010 | Sanfilippo et al. | |
| 2018/0033895 A1* | 2/2018 | Mazzillo | H10F 39/806 |
| 2019/0198701 A1* | 6/2019 | Moussy | H10F 77/1642 |
| 2020/0013915 A1 | 1/2020 | Mazzillo et al. | |
| 2022/0093807 A1 | 3/2022 | Ayel et al. | |
| 2022/0271067 A1* | 8/2022 | Sugiura | H10F 30/225 |

* cited by examiner

*Primary Examiner* — Thanh Luu
(74) *Attorney, Agent, or Firm* — Seed Intellectual Property Law Group LLP

(57) ABSTRACT

The present disclosure relates to a process to control an optoelectronic device comprising a single-photon avalanche diode n a substrate, wherein the diode comprises a first region doped with a first type of conductivity level with a first face of the substrate and a second region doped with a second type of conductivity extending from the first face to a second face of the substrate opposed to the first face, wherein the device comprises a third conducting or semi-conducting region at the second face, wherein the process comprises the application of a biasing voltage to the third region in order to generate an electric field that accelerates the charges generated in the diode.

22 Claims, 2 Drawing Sheets

OPTOELECTRONIC DEVICE

CROSS-REFERENCE TO RELATED APPLICATION(S)

This application claims the priority benefit of French patent application number FR2305136, filed on May 24, 2023, entitled "Dispositif optoélectronique," which is hereby incorporated by reference to the maximum extent allowable by law.

BACKGROUND

Technical Field

The present disclosure relates generally to the optoelectronic devices, and more specifically to the optoelectronic devices comprising a single-photon avalanche diode (SPAD).

Description of the Related Art

A photodiode is a semiconductor component able to detect rays in the optical domain and turn them into an electric signal.

Single Photon Avalanche Diodes (SPAD) are photodiodes. SPADs are avalanche photodiodes that are operated above the breakdown voltage and a photon that reaches the multiplication area can alone initiate an avalanche and lead to the breakdown of the junction.

BRIEF SUMMARY

One or more embodiments address all or some of the drawbacks of known devices comprising SPADs.

An embodiment relates to a process to control an optoelectronic device comprising a single-photon avalanche diode in a substrate, wherein the diode comprises a first region, doped with a first type of conductivity, level with a first face of the substrate and a second region, doped with a second type of conductivity, extending from the first face to a second face of the substrate opposed to the first face, wherein the device comprises a third conducting or semiconducting region at the second face, wherein the process comprises the application of a biasing voltage to the third region in order to generate an electric field that accelerates the charges generated in the diode.

According to an embodiment, the first region is the cathode and the second region is the anode, wherein the biasing voltage is negative.

According to an embodiment, the biasing voltage is between −20 V and −1 V.

According to an embodiment, the device comprises a plurality of single-photon avalanche diodes, each diode comprising a third region, wherein the third regions of all diodes are biased with the same biasing voltage.

According to an embodiment, the device comprises insulated conductive walls that separate the diodes from each other.

According to an embodiment, the second region comprises a first part level with the first face of the substrate and higher than the height of the first region, and a second part extending from the first part to the second face.

According to an embodiment, a current lower than 50 pA flows between the first part and the third region.

According to an embodiment, the second part is fully depleted.

According to an embodiment, the third region is a third part of the second region, wherein the third part is level with the second face of the substrate and the third part is separated from the first part by the second part.

According to an embodiment, the third parts of all diodes are linked by conductive pads located between the third parts aligned with the walls.

According to an embodiment, the process comprises the application of a rising voltage to the third part until reaching a value where the current between the first and third parts reaches a threshold value, wherein the threshold value is not more than 50 pA.

According to an embodiment, the third region is a conducting layer extending on the second face of the substrate, separated from the second face of the substrate by a dielectric layer.

According to an embodiment, the third region is made of a material transparent at the working wavelengths of the diode.

According to an embodiment, the biasing voltage is generated by a negative charge pump.

Another embodiment relates to an optoelectronic device comprising a single-photon avalanche diode in a substrate, wherein the diode comprises a first region, doped with a first type of conductivity, level with a first face of the substrate and a second region, doped with a second type of conductivity, extending from the first face to a second face of the substrate opposed to the first face, wherein the device comprises a third conducting or semiconducting region at the second face, wherein the device is designed to be controlled by the controlling process as described above.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
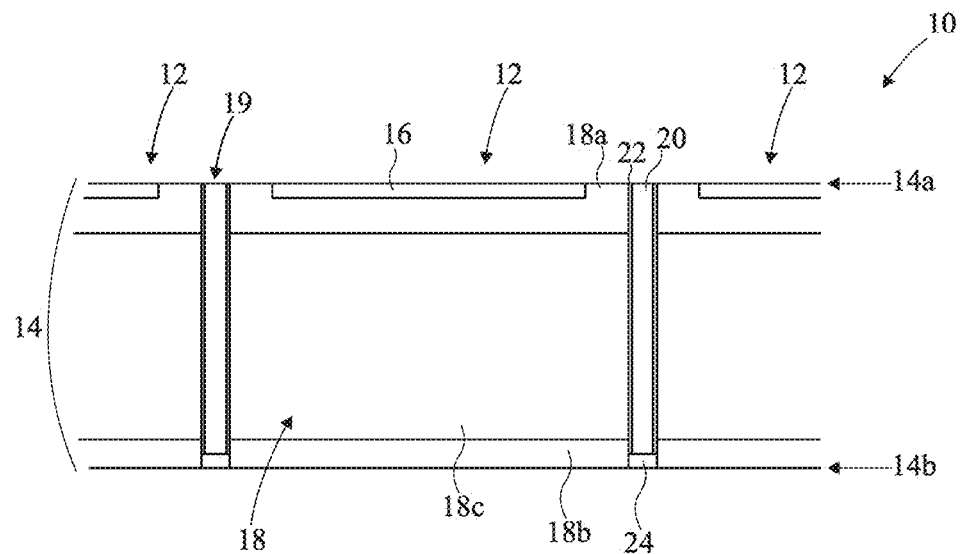
FIG. 1 represents an embodiment of an optoelectronic device comprising SPADs.

FIG. 1 represents an embodiment of the optoelectronic device 10 comprising SPADs 12. More specifically, for example, the SPADs are parts of a light sensor of the device 10. For example, the device 10 is a time-of-flight camera. The device 10 generates, for example, an image specifying the distance between the device and the various parts of a scene, whose image is a picture.

The device 10, more specifically the light sensor, comprises, for example, a plurality of pixels, preferably as an array. Each pixel comprises, for example, a SPAD 12. FIG. 1 represents three SPASs 12, two of them being partly displayed. Each pixel generates, for example, a piece of distance data corresponding to a pixel of the image and to a place in the scene.

The SPADs 12 are located in a substrate 14. Preferably, all the SPADs 12 are located in the same substrate 14. The substrate 14 is a semiconductor substrate, for example made of silicon. The substrate 14 has a height between 1 µm and 20 µm, for example equal to 10 µm.

Each SPAD comprises a capsule 16. The capsule 16 lies inside the substrate 14. The capsule 16 is level with an upper face or surface or front face 14a of the substrate 14. In other words, the upper face of the capsule 16 is coplanar with the upper face of the substrate 14. The capsule 16 is doped with a first type of conductivity. For example, the capsule 16 is N-doped and corresponds to the cathode of the SPAD.

Each SPAD comprises a region 18. The region 18 is doped opposed to the type of doping of the capsule 16. For example, the region 18 is P-doped. The region 18 corresponds, for example, to the anode of the SPAD. The capsule 18 lies inside the substrate 14. The region 18 extends, for example, from the upper face 14a of the substrate to the lower face or surface or rear face 14b opposed to the face 14a. The PN junction between the regions 16 and 18 is the avalanche junction.

The region 18 comprises, for example, a first part 18a located at the face 14a. The lower part 18a extends from the upper face 14a of the substrate to a lower part of the lower face of the capsule 16. Thus, the lateral walls of the capsule 16 and the bottom of the capsule 16 are in contact with the part 18a. The height of the part 18a is higher than the height of the capsule 16. For example, the thickness of the part 18a is greater than the thickness of the capsule 16. The part 18a preferably encompasses the region 16. Thus, at the upper face 14a of the substrate 14, the part 18a constitutes a ring around the region 16. The concentration of doping elements in the part 18a is, for example, substantially constant. The first part constitutes a first electrode of the anode.

The region 18 comprises a second part 18b. The part 18b is located at the lower face 14b of the substrate 14. The part 18b is level with the face 14b of the substrate 14. The part 18b extends from the face 14b to a lower level of the lower face of the part 18a. The part 18b preferably extends in front of the whole part 18a. In particular, the part 18b extends in front of the capsule 16, preferably in front of the whole capsule 18. Preferably, the concentration of doping elements in the part 18b is not more than the concentration of doping elements in the part 18a. Preferably, the concentration of doping elements in the part 18b is substantially constant. The part 18b constitutes a second electrode of the anode.

The region 18 comprises a third part 18c. The part 18c is located between the parts 18a and 18b. In other words, the part 18c is located between the upper face of the part 18b and the lower face of the part 18a. The part 18c extends preferably in the whole substrate between the parts 18a and 18b. The concentration of doping elements in the part 18c is preferably gradual. The concentration of doping elements in the part 18c preferably decreases with the distance to the part 18a. The concentration of doping elements in the part 18c is much less than the concentration of doping elements in the part 18a and to the concentration of doping elements in the part 18b. The part 18c is designed to be fully depleted when the SPAD is working.

The concentration of doping elements in the part 18c is, for example, at least ten times less than the concentration of doping elements in the part 18a. The concentration of doping elements in the part 18c is, for example, at least fifteen times less than the concentration of doping elements in the part 18b.

Each SPAD 12 is partly separated from each neighboring SPAD by an insulated conductive wall 19, which means a wall comprising a conductive core 20 and a dielectric sheet or layer 22 on the sidewall of the conductive core 20. Each sheet 22 is made of a dielectric material, for example of silicon dioxide or of silicon nitride. For example, each core 20 is made of a metal.

The core 20 is preferably fully laterally encompassed by the sheet. In other words, the lateral walls of the core 20 are preferably fully covered with the sheet 22. Each wall 19 is level with the face 14a. More accurately, the upper face of the core and an upper face of the sheet are level with the upper face of the substrate 14. Each wall 19 extends on at least the whole height of the part 18a. In other words, the part 18a is fully laterally encompassed by the walls 19. Each wall extends preferably on the whole height of the parts 18a and 18b. Thus, the parts 18a and 18b are preferably fully laterally encompassed. Each wall 19 extends preferably on a part of the height of the part 18b. Thus, a part of the lateral walls, for example the upper part of the part 18b is covered with the walls 19. A part of the lateral walls, for example the lower part of the part 18b is not covered with the walls 19.

The device further comprises conductive pads 24, for example made of metal. The pads 24 are located between the SPADs. The pads 24 are located aligned with the walls 19, which means at the level of the lower end of each wall 19. Preferably, the pads 24 have horizontal dimensions substantially equal to the horizontal dimensions of the lower face of the walls 19. In the example of FIG. 1, the pads 24 are in contact with the wall 19, in particular with the conductive core 20. As a variant, each pad 24 can be separated from the core 20 with a dielectric layer. The pads 24 are in contact with the parts 18b of the neighboring SPADs. Thus, at least some parts 18b of the SPADs, preferably all parts 18b of the SPADs are coupled with each other with the pads 24. Thus, said parts 18b of the SPADs, preferably all SPADs, can be biased at the same voltage.

Preferably, the pads 24 do not extend on the lower face of the part 18b. As a variant, pads 24 made of a material transparent at the working wavelengths of the SPAD can at least partly cover the lower face of the part 18b.

The device 10 is designed to apply a voltage Vca when the SPADs are working, i.e., at least when charges are generated inside the SPADs. The voltage Vca is a negative voltage. The voltage is, for example, between −20 volts (V) and −1 V.

The voltage Vca, and possibly the values of the doping of the parts 18b and 18c, are selected so that they generate an electric field to attract the charges to the cathode of the SPAD. The voltage Vca, and possibly the values of the doping of the parts 18b and 18c, are further selected so that the current through the anode, which means the current between the part 18b and the part 18a is weak, possibly null. For example, the voltage Vca, and possibly the values of the doping of the parts 18b and 18c, are selected so that the current between the parts 18a and 18b is less than 50 pA. In other words, the voltage Vca, and possibly the values of the doping of the parts 18b and 18c, are selected so that, when the SPAD is working, the part 18c is fully depleted and has a high impedance, for example more than $10^{11}$ Ohm.

Figure 2:
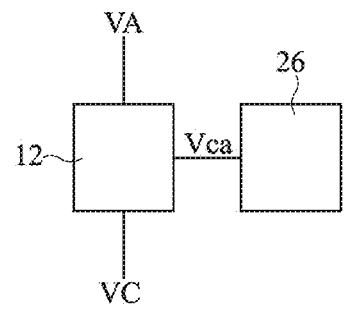
FIG. 2 schematically represents a circuit of the device of FIG. 1.

FIG. 2 schematically represents a circuit of the device of FIG. 1. More specifically, FIG. 2 shows a SPAD 12 and a control circuit 26 of the SPAD 12.

The SPAD 12 is coupled, preferably connected, by a cathode electrode to an application node for a voltage VC. Similarly, the SPAD 12 is coupled, preferably connected, by an anode electrode corresponding to the part 18a, to an application node for a voltage VA. The voltages VA and VC make it possible to read the SPAD. For example, the voltage VA is null and the voltage VC is a positive voltage.

The SPAD 12 further comprises another anode electrode corresponding to the part 18b, which receives the voltage Vca. The voltage Vca is generated by the control circuit 26. The voltage Vca is applied to the pads 24, for example through the core 20.

The control circuit 26 comprises, for example, a weak current source, for example a negative charge pump circuit.

Figure 3:
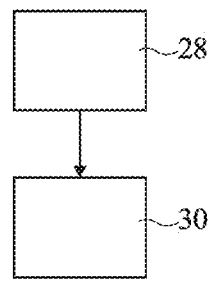
FIG. 3 schematically represents a controlling process of the device of FIG. 1.

FIG. 3 schematically represents a controlling process of the device of FIG. 1. More specifically, FIG. 3 shows a process to measure the voltage Vca.

During a first step 28, the circuit 26 applies a rising voltage in absolute value to the pads 24. For example, the circuit 24 applies a decreasing negative voltage from a null voltage.

The process of FIG. 3 comprises a step 30 where the control circuit 26 determines that a current starts flowing through the SPAD, more specifically starts flowing between the parts 18a and 18b, for example a current less than a threshold current. The threshold current is, for example, not more than 50 picoamps (pA) per device, which can be measured on a set of devices, for example on a set of a million SPADs. The voltage Vca corresponds to the voltage applied when the current reaches the threshold value. Then, the value Vca is maintained while the SPADs are working.

For example, the process of FIG. 3 is made periodically, for example at each start of the device 10.

As a variant, the voltage value Vca applied while the SPADs are working corresponds, for example, to a value lower than the value of the voltage Vca when the current between the parts 18a and 18b reaches the threshold current value. For example, the voltage value Vca applied while the SPADs are working corresponds, for example, to 95% of the voltage Vca when the current between the parts 18a and 18b reaches the threshold current value.

Figure 4:
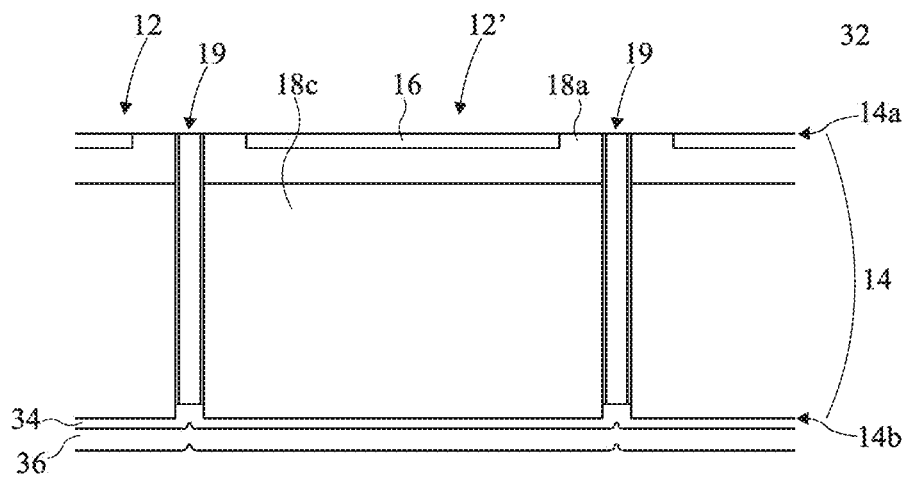
FIG. 4 represents another embodiment of an optoelectronic device comprising SPADs.

FIG. 4 represents another embodiment of the optoelectronic device 32 comprising SPADs 12'.

The device 32 comprises elements as previously described in relationship with FIG. 1. More specifically, the device 32 comprises a plurality of SPADs 12' arranged like the SPADs 12 of FIG. 1. The SPADs 12' are separated by walls 19, like the SPADs 12. Like the SPADs 12, the SPADs 12' comprise the capsule 16, the part 18a of the region 18 and the part 18c of the region 18. The SPADs 12' of FIG. 4 do not comprise the part 18b and the pads 24.

The device 32 comprises a dielectric layer 34 that extends in accordance on the lower face 14b of the substrate. The layer 34 preferably fully covers the lower face of the substrate 14. Thus, the layer 34 extends on all the lower face of the part 18c and on the lower face of the walls 19. More precisely, the layer 34 extends on the lower face of the cores 20.

The device 32 also includes a conductive layer 36. The conductive layer 36 covers, preferably fully, the layer 32. Thus, the layer 36 extends in front of the lower face of the part 18c and of the lower face of the walls 19. The layer 36 extends at least in front of all the lower face of each SPAD. Thus, all the lower face of each region 18 is covered with the stacking of the layer 34 and of the layer 36. Hence, it is separated from the layer 36 by the layer 34.

Thus, the layers 34, 36 and the region 18 constitute a capacitor of type conductor-dielectric-semiconductor. Thus, each SPAD comprises an electrode corresponding to the cathode, an electrode corresponding to the anode, and a first terminal of the capacitor and an electrode corresponding to the second terminal of the capacitor.

The layers 34 and 36 are made of materials transparent to the working wavelengths of the SPADs 12'. For example, the layer 34 is made of silicon dioxide. For example, the layer 36 is made of a metallic oxide.

The device is designed so that a voltage Vca is applied to the layer 36 while the SPADs are working. Since the layer 36 continuously covers the lower face of a plurality of SPADs, preferably of all SPADs, the same voltage Vca is applied to the parts of the layer 36 that are in front of each said SPAD. So, the device comprises not illustrated elements that make it possible to apply the voltage Vca to the layer 36, for example through the cores 20.

The part 18c of the region 18 is dropped so that, when the voltage Vca is null, the part 18c is fully depleted.

The voltage Vca is negative. For example, the voltage Vca is between −20 V and −1 V. The voltage Vca is applied, for example, through a circuit such as the one of FIG. 2, the control circuit 26 comprising a negative charge pump.

Thus, there is always an electric field in the SPAD that attracts charges. Applying such a voltage Vca does not imply the generation of an intense current. For example, the current between the layer 36 and the part 18a is less than 50 pA, for example null.

The region 18b could have been positioned on the same face of the substrate 14 as the region 18a and could have been separated from the part 18a by a portion of the part 18c. However, the dimensions, in particular the horizontal dimensions, i.e., in the plane of the face 14a of each SPAD would be much more than the dimensions of the previously described embodiments. The density of pixels would then be much lower in the device.

Values of doping of the region 16 and of the part 18a could have been modified in order to increase the electric field and increase the speed of the charges. However, changing the values of doping of the region 16 and of the part 18a would lead to changing the characteristics of the SPAD, for example the breakdown voltage and probability.

An advantage of the described embodiments is that the generated charges are attracted faster to the cathode. Thus, there is a lower risk of unwanted jitter between the absorption of the photon and the initiation of the avalanche.

Another advantage of the described embodiments is that the application of the voltage Vca generates a tiny dissipation of power.

Another advantage of the described embodiments is that the increase of the electric field mainly depends on the value of the voltage Vca and on the values of doping of the parts 18b and 18c. Thus, the same voltage Vca can be applied to SPADs with different characteristics, i.e., with different values of doping for the region 16 and the part 18a.

Various embodiments and variants have been described. Those skilled in the art will understand that certain features of these embodiments can be combined and other variants will readily occur to those skilled in the art. In particular, the cathode and the anode can be switched. Thus, the region 16 can be the anode of the SPAD and be P-doped. The region 18 can thus be the cathode of the SPAD and be N-doped. The voltage Vca is thus positive, for example between 1 V and 20 V.

Finally, the practical implementation of the embodiments and variants described herein is within the capabilities of those skilled in the art based on the functional description provided hereinabove.

A process to control an optoelectronic device (10, 32) may be summarized as including a single-photon avalanche diode (12, 12') (SPAD) in a substrate (14), wherein the diode comprises a first region (16), doped with a first type of conductivity, level with a first face (14a) of the substrate (14) and a second region (18), doped with a second type of conductivity, extending from the first face (14a) to a second face of the substrate (14b), opposed to the first face (14a), wherein the device (10, 32) comprises a third conducting or semiconducting region (18b, 36) at the second face (14b), wherein the process comprises the application of a biasing voltage (Vca) to the third region (18b, 36) in order to generate an electric field that accelerates the charges generated in the diode.

An optoelectronic device (10, 32) may be summarized as including a single-photon avalanche diode (12, 12') (SPAD) in a substrate (14), wherein the diode comprises a first region (16), doped with a first type of conductivity, level with a first face (14a) of the substrate (14) and a second region (18), doped with a second type of conductivity, extending from the first face (14a) to a second face of the substrate (14b) opposed to the first face (14a), wherein the device (10, 32) comprises a third conducting or semiconducting region (18b, 36) at the second face (14b), wherein the process is designed to generate a biasing voltage (Vca) to the third region (18b, 36) in order to generate an electric field that accelerates the charges generated in the diode.

The first region (16) is the cathode and the second region (18) is the anode, wherein the biasing voltage (Vca) is negative.

The biasing voltage (Vca) is between −20 V and −1 V.

The device comprises a plurality of single-photon avalanche diodes (12, 12') (SPAD), each diode comprising a third region (18b, 36), wherein the third regions of all diodes are biased with the same biasing voltage (Vca).

The device comprises insulated conductive walls (19) that separate the diodes from each other.

The second region (18) comprises a first part (18a) level with the first face (14a) of the substrate (14) and extending higher than the height of the first region (16) and a second part (18b) extending from the first part (18a) toward the second face (14b).

A current less than 50 pA flows between the first part (18a) and the third region (18b, 36).

The second part (18c) is fully depleted.

The third region is a third part (18b) of the second region (18), wherein the third part (18b) is level with the second face (14b) of the substrate and the third part (18b) is separated from the first part (18a) by the second part (18c).

The third parts (18b) of all diodes (12) are coupled by conductive pads (24) located between the third parts (18b), aligned with the walls (19).

A process including the application of a rising voltage to the third part (18b) until reaching a value where the current between the first (18a) and third (18b) parts reaches a threshold value, wherein the threshold value is not more than 50 pA.

The third region is a conducting layer (36) extending on the second face (14b) of the substrate, separated from the second face (14b) of the substrate by a dielectric layer (34).

The third region (36) is made of a material transparent at the working wavelengths of the diode.

The biasing voltage is generated by a negative charge pump.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process to control an optoelectronic device, the process comprising:
applying a biasing voltage to the optoelectronic device, the optoelectronic device including:
a substrate having a first face opposite a second face;
a single-photon avalanche diode (SPAD) in the substrate, the SPAD including:
a first region doped with a first type of conductivity, level with the first face; and
a second region doped with a second type of conductivity, extending from the first face to the second face;
a dielectric layer on the second face; and
a conductive region at the second face, the conductive region being a conducting layer extending on the second face and separated from the second face by the dielectric layer, the applying of the biasing voltage to the optoelectronic device including applying the biasing voltage to the conductive region; and
generating an electric field that accelerates charges generated in the SPAD in response to the applying of the biasing voltage to the conductive region.

2. The process according to claim 1, wherein the first region is a cathode and the second region is an anode, and the biasing voltage is negative.

3. The process according to claim 2, wherein biasing voltage is between −20 volts and −1 volts.

4. The optoelectronic device according to claim 2, wherein the device comprises a control circuit configured to apply a first voltage to the first region, a second voltage to the second region, and the biasing voltage to a third region level with the second face.

5. The process according to claim 1, wherein
the optoelectronic device includes a plurality of the SPADs, and the applying of the biasing voltage to the optoelectronic device includes applying the biasing voltage to the conductive regions of all of the plurality of the SPADs.

6. The process according to claim 5, wherein the optoelectronic device includes insulated conductive walls that separate the plurality of the SPADs from each other.

7. The process according to claim 6, wherein
the second region includes a first part level with the first face of the substrate and extending higher than a height of the first region, and a second part extending from the first part toward the second face,
the conductive region is a third part of the second region, and the third part is level with the second face of the substrate and is separated from the first part by the second part, and
the third parts of all of the plurality of the SPADs are coupled to each other by conductive pads that are located between the third parts and are aligned with the insulated conductive walls.

8. The process according to claim 1, wherein the second region includes:
a first part level with the first face of the substrate and extending higher than a height of the first region; and
a second part extending from the first part toward the second face.

9. The process according to claim 8, wherein a current less than 50 picoamps flows between the first part and the conductive region.

10. The process according to claim 8, wherein the second part is fully depleted.

11. The process according to claim 8, wherein
the conductive region is a third part of the second region, and
the third part is level with the second face of the substrate and is separated from the first part by the second part.

12. The process according to claim 11, further comprising:
applying a rising voltage to the third part until reaching a value where a current between the first and third parts reaches a threshold value, the threshold value being not more than 50 picoamps.

13. The process according to claim 8, wherein the conductive region is made of a material transparent at working wavelengths of the SPAD.

14. The process according to claim 1, wherein the biasing voltage is generated by a negative charge pump.

15. The process according to claim 1, wherein the process includes applying a first voltage to the first region and a second voltage to the second region.

16. An optoelectronic device comprising:
a substrate having a first face and a second face opposite to the first face;
a single-photon avalanche diode (SPAD) in the substrate, the SPAD including:
a first region doped with a first type of conductivity, level with the first face; and
a second region doped with a second type of conductivity, extending from the first face to the second face;
a dielectric layer on the second face;
a conductive region separated from the second face by the dielectric layer; and
a control circuit configured to apply a biasing voltage to the conductive region in order to generate an electric field that accelerates charges generated in the SPAD.

17. The optoelectronic device according to claim 16, wherein the first region is a cathode and the second region is an anode, and the biasing voltage is negative.

18. The optoelectronic device according to claim 17, wherein biasing voltage is between −20 volts and −1 volts.

19. A device comprising:
a substrate having a first face opposite a second face;
a single-photon avalanche diode (SPAD) in the substrate, the SPAD including:
a first region having a first conductivity type, the first region including a first portion, a second portion, and a third portion having different doping concentrations, the first portion being spaced by the third portion by the second portion;
a second region having a second conductivity type, the second region being in the first portion of the first region, the second region being spaced from the second portion of the first region by the first portion of the first region; and
a control circuit configured to apply a biasing voltage to the third portion of the first region; and
a dielectric layer on the second face;
a conductive region separated from the second face by the dielectric layer.

20. The device according to claim 19, further comprising:
a first wall; and
a second wall, the SPAD positioned between the first wall and the second wall, each of the first wall and the second wall including a conductive core and a dielectric layer on the conductive core.

21. The device according to claim 20, wherein the conductive cores of the first and second walls are coplanar with the first face of the substrate.

22. The device according to claim 19, wherein the first conductivity type is P-type and the second conductivity type is N-type.

* * * * *